United States Patent
Trequattrini et al.

(10) Patent No.: US 7,538,553 B2
(45) Date of Patent: May 26, 2009

(54) MAGNETIC STRUCTURE FOR MRI MACHINES AND MRI MACHINE PARTICULARLY FOR ORTHOPEDIC OF RHEUMATOLOGIC APPLICATIONS

(75) Inventors: Alessandro Trequattrini, Genoa (IT); Stefano Pittaluga, Genoa (IT); Stefano Besio, Genoa (IT); Eugenio Biglieri, Masio (IT)

(73) Assignee: Esaote S.p.A., Casale Monferrato (IT)

( * ) Notice: Subject to any disclaimer, the term of this patent is extended or adjusted under 35 U.S.C. 154(b) by 0 days.

(21) Appl. No.: 12/033,698

(22) Filed: Feb. 19, 2008

(65) Prior Publication Data

US 2008/0197845 A1      Aug. 21, 2008

(30) Foreign Application Priority Data

Feb. 20, 2007   (EP)   .................. 07425094

(51) Int. Cl.
    *G01V 3/00*   (2006.01)
(52) U.S. Cl. ....................... 324/319; 324/322
(58) Field of Classification Search ......... 324/300–322; 600/407–445; 335/299
    See application file for complete search history.

(56) References Cited

U.S. PATENT DOCUMENTS

| | | | | |
|---|---|---|---|---|
| 4,875,485 | A * | 10/1989 | Matsutani | 600/415 |
| 5,982,260 | A * | 11/1999 | Byrne | 335/216 |
| 6,191,584 | B1 * | 2/2001 | Trequattrini et al. | 324/319 |
| 6,211,676 | B1 * | 4/2001 | Byrne et al. | 324/319 |
| 6,720,770 | B2 * | 4/2004 | Biglieri et al. | 324/322 |
| 6,950,001 | B2 * | 9/2005 | Kruip et al. | 335/296 |
| 7,332,912 | B2 * | 2/2008 | Pittaluga et al. | 324/320 |
| 2002/0022779 | A1 | 2/2002 | Kose | |

(Continued)

FOREIGN PATENT DOCUMENTS

| | | |
|---|---|---|
| EP | 0 921 408 B1 | 6/1999 |
| EP | 0 984 293 A1 | 3/2000 |
| JP | 7-265280 A | 10/1995 |
| WO | WO 03/052441 A1 | 6/2003 |
| WO | WO 2004/047640 A1 | 6/2004 |

OTHER PUBLICATIONS

Abstract entitled Permanent Magnet-Based MRI (Imaging) by David Mitchell Cole, p. 1957, (1997).

(Continued)

*Primary Examiner*—Brij B Shrivastav
(74) *Attorney, Agent, or Firm*—Buchanan Ingersoll & Rooney PC

(57) ABSTRACT

Magnetic structure for MRI machines, which machine has a U-shaped or annular, that is O-shaped geometry having two opposite poles between which a magnetic field is generated and are borne at a predetermined distance one with respect to the other by a magnetic yoke having an inverted U shape or an annular one, that is an O shape, which poles generating the magnetic field and/or at least a part of which yoke delimit a cavity housing at least a part of the patient body, while inside the volume of said cavity a partial volume is generated wherein values of the magnetic field are such to guarantee the acquisition of MRI images having quality characteristics sufficient to be used like diagnostic images, so called imaging volume.

The invention relates also to a machine for detecting MRI images particularly of the anatomical region of the hand or the foot or part of joints and which machine has a magnetic structure of the type described above.

34 Claims, 8 Drawing Sheets

U.S. PATENT DOCUMENTS

2004/0119473 A1 6/2004 Aksel et al.
2005/0068140 A1 3/2005 Huang et al.
2007/0244385 A1 10/2007 Satragno et al.

OTHER PUBLICATIONS

European Search Report dated Jul. 27, 2007.

A. Trequattrini et al., "A Novel 0.25 T Dedicated MRI Apparatus", IEEE Transactions on Applied Superconductivity, Jun. 2006, vol. 16, No. 3, pp. 1505-1508, XP-002442106 (cited in the attached European Search Report).

F. Bertora et al., "A Dedicated MRI Apparatus for Medical and Industrial Applications", Magnetic Resonance Imaging, 1994, vol. 12, No. 3, pp. 329-331, XP-002442107 (cited in the attached European Search Report).

* cited by examiner

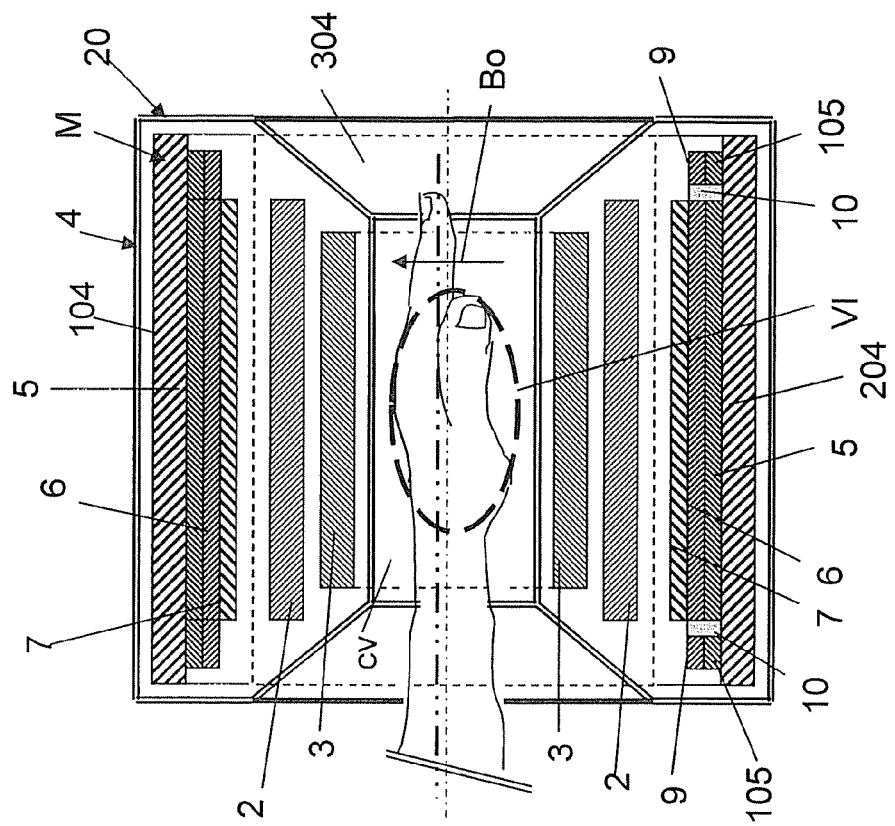
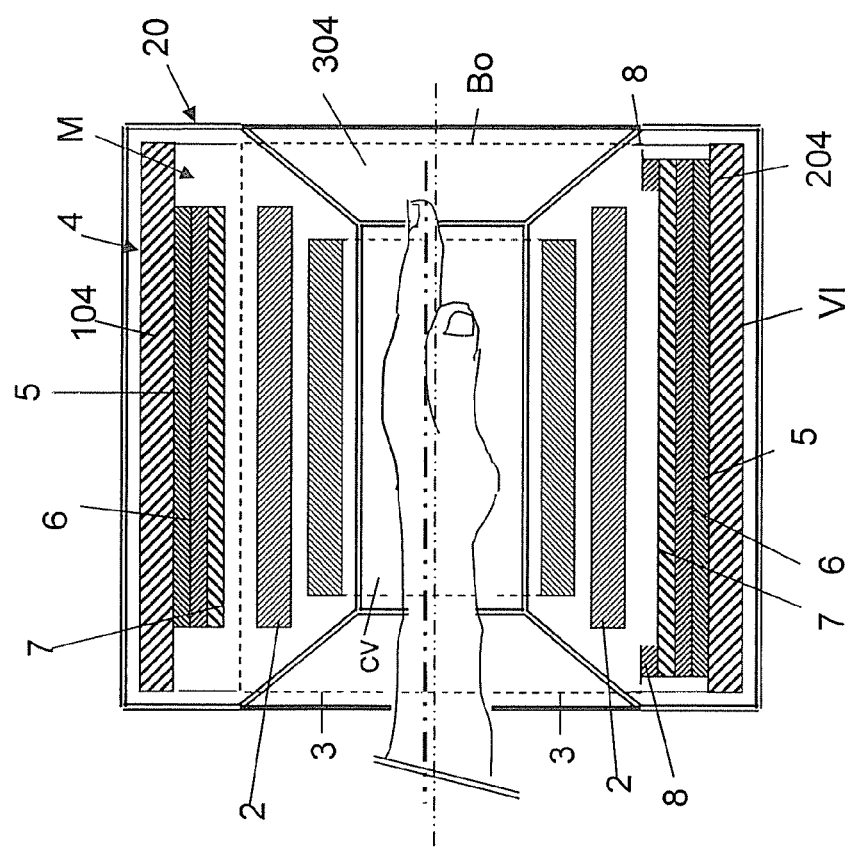

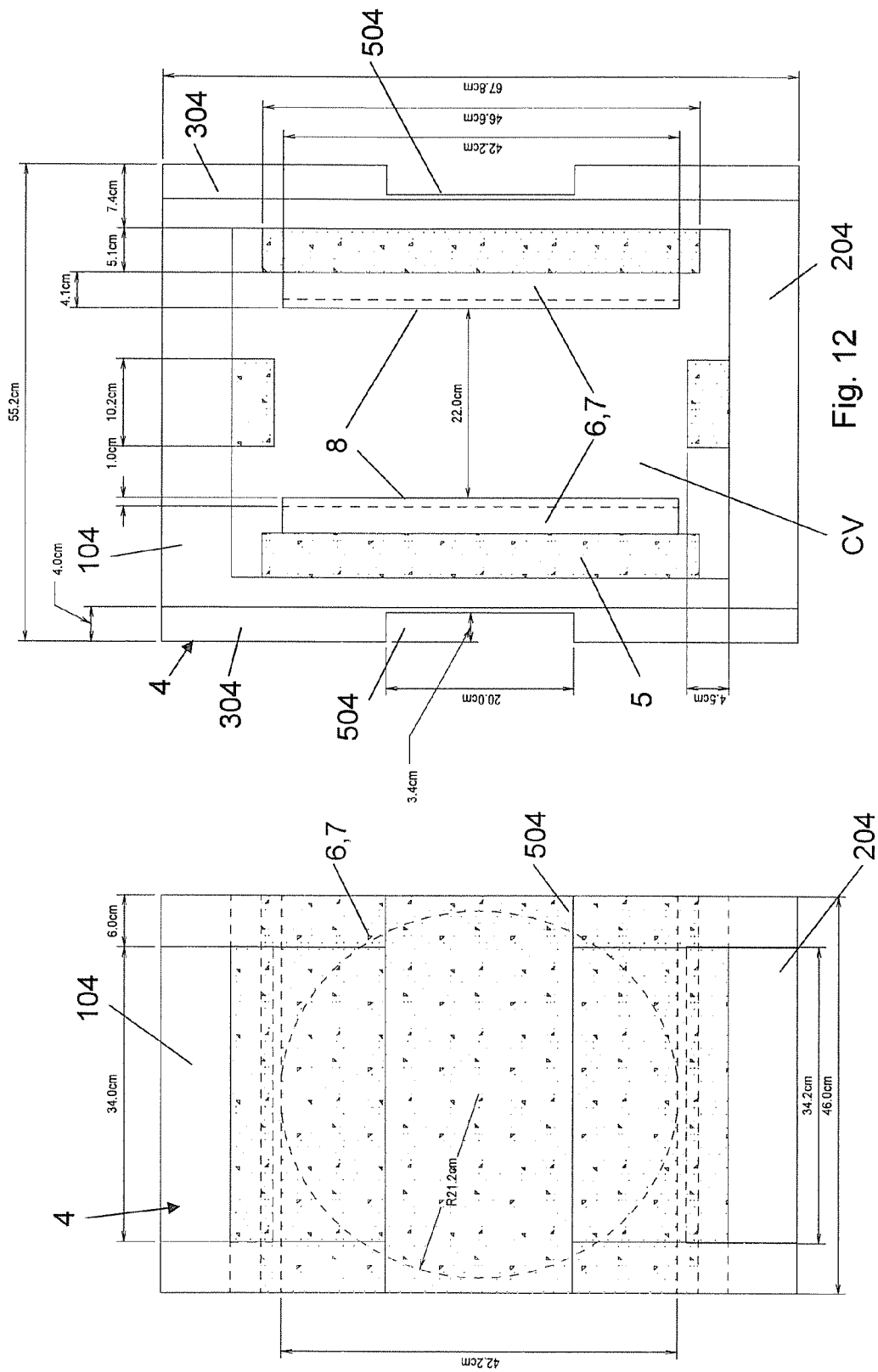

MAGNETIC STRUCTURE FOR MRI MACHINES AND MRI MACHINE PARTICULARLY FOR ORTHOPEDIC OF RHEUMATOLOGIC APPLICATIONS

The present invention relates to a magnetic structure for MRI machines, which machine has a U-shaped geometry or an annular one, that is an O-shaped one, having a magnetic yoke with an inverted U shape, or an annular shape, that is an O shape at least a part of which yoke delimits a cavity housing at least a part of the patient body, which yoke, on one or two opposite sides or on various sides interfacing the cavity, bears means for generating a magnetic field and at least two poles overlapping said means generating the magnetic field, while within the volume of said cavity a partial volume is generated wherein values of the magnetic field are such to guarantee the acquisition of MRI images having quality characteristics sufficient for being used as diagnostic images, so called imaging volume.

When making magnetic structures for MRI machines various criteria have to be considered due to requirements for using them.

First, the size of the magnetic structure depends on the size of the cavity housing the patient or a part of the patient body. The size of said cavity substantially depends on the kind of anatomical regions for which the machine is intended to acquire MRI images.

At present machines for acquiring nuclear magnetic resonance images are basically of two types. A type of machine called "total body" has a magnetic structure defining a cavity housing the patient having such a size to allow the whole cross section of a patient body or even the whole patient body to enter in the cavity. These machines have annular or C-shaped or U-shaped magnetic structures having such a cross section that the cavity defined by the magnetic structure is greater than the cross section of the patient body and they have different axial lengths depending on the fact if the cavity defined by the magnetic structure houses partially or totally the patient body. Obviously these machines have a magnetic structure comprising the yoke, means generating the magnetic field, for example of the resistive or superconducting type or even with permanent magnets, and poles that has such a size that the cavity defined by it can partially or totally house the patient body. These machines have a high cost and their installation is a complex one since it needs correspondingly large rooms and above all it requires rooms having floors able of supporting the considerable weight being about ten to about one hundred of tons. So called "totalbody" machines are used not only for acquiring diagnostic images with reference to the orthopedic field, but above all diagnostic images of the tomographic type and are intended to detect also the presence of tumoral or vascular diseases.

A second type of machines, called "dedicated" machines, comprise U-shaped, C-shaped or annular magnetic structures having such a size to be adapted to examine the patient with reference only to some anatomical regions or parts of a patient body, such as for example the head, the shoulder, the knee and the backbone. Generally dedicated machines are manufactured considering dimensional requirements of the cavity defined by the magnetic structure with reference to body parts to be housed inside said cavity. Moreover this kind of machines is designed on the basis of the size of the cavity to be enclosed by the magnetic structure and with reference to the body part to be housed in said cavity and having greatest dimensions and however in such a way to allow the machine to be used for acquiring images of various different anatomical regions. Such requirement often needs to combine these magnetic structures with patient-supporting table or bed that are complex and movably connected to the magnetic structure. The advantage of this kind of machines is to require magnetic fields having a limited imaging volume and so it allows to keep relatively small and not much heavy magnetic structures. However the searched multi-task, with reference to the number of different anatomical regions of which it is possible to acquire images, requires technical efforts related also to overall dimensions and costs as regards patient-supporting beds or tables that often have to be made in a dedicated way for the machine. Dedicated machines have magnetic structures that generally generate a static magnetic field between 0.1 and 0.5 tesla. Moreover since the magnetic field has a medium low intensity, also the RF signal of echoes of nuclear spins has a low intensity, so in dedicated machines receiving coils have to be very close to anatomical regions of which image has to be acquired. When said MRI machines are dedicated for acquiring images of different anatomical regions, said coils have to be suitably interchangeable in order to be adapted to the anatomical region to be examined and both as regards the size and the morphology of the anatomical region and as regards the manufacturing of the circuit of the coil with reference to the morphology of the anatomical region. This type of machine has limited size volumes with magnetic structures having a volume comprised from 0.03 and $1m^3$ with weights lower than one ton. Costs are correspondingly reduced and also the installation is less difficult both as regards the volume of rooms or spaces wherein machines have to be put and as regards floors supporting the weight.

As regards mere orthopedic applications particularly related to the hand or the foot and possibly to the knee, also current dedicated machines are too much big and too much expensive, particularly if used by little surgeries or by single practitioners that cannot meet the economic burden both of the dedicated machine and of structures required for installing it. Therefore there is the need for still smaller, less heavy and less expensive dedicated machines without compromising functionalities related to the imaging quality. However such need is in conflict with needs related to physics of the technique acquiring nuclear magnetic resonance images. The fact of reducing the overall dimensions and the weight of an MRI machine is directly related to the fact of reducing the overall dimensions and the weight of means generating the magnetic field that in turn affects both the intensity of the field that can be obtained for the static field, and aberrations or quality decadences of image due to the fact that openings of the magnetic structure needed to insert the patient inside the cavity are very close to the desired and necessary imaging volume for correctly carrying out the examination. Currently it is considered that below a certain intensity of the static magnetic field necessary for orienting spins of atom nuclei of the anatomical region to be examined the signal is not more sufficient for generating echo signals that can be used for reconstructing images having a diagnostic utility. Particularly such limit is an insuperable one as regards so called homogeneous static magnetic field machines, i.e. machines wherein the static magnetic field has a constant level in the cavity defined by the magnetic structure or in a part of said cavity, so called imaging volume, within tolerances in the order of 1 to 50 ppm (parts per million) peak to peak.

A further drawback in making small machines still related to the ratio between the size of the magnetic structure and the homogeneity characteristics of the magnetic field is the fact that the reduction of the size of the magnetic structure leads to a reduction of size of the cavity. Since the cavity is provided with at least two opposite open sides or with three open sides, and since said open sides generate a distortion of the static magnetic field in the form of a swelling of field lines from the inside towards the outside of the magnetic structure, it is believed that the part of the housing cavity defined by the magnetic structure wherein the static magnetic field has an homogeneity within above tolerances is drastically reduced when dimensions of the cavity are very small. This depends on the fact that distorsions of the magnetic field due to said openings are greater by approaching the openings, so the region of the cavity wherein the field is less affected by distorsions due to openings and wherein the magnetic field has such characteristics to be considered satisfactory for acquiring useful images without aberrations or artefacts are limited to a partial region of the whole volume of the cavity whose ideal boundaries are far away from peripheric regions of the cavity. Therefore in order to acquire MRI images the whole volume of the cavity permeated by the static magnetic field cannot be used, but only a part of said volume that is sufficiently far away from openings of the magnetic structure can be used. Only inside this partial volume, so called imaging volume the magnetic field has an homogeneity within above mentioned tolerances.

In the technical field of homogeneous static magnetic field MRI machines the combination of above impediments or drawbacks regarding a drastic reduction of the size of the magnetic structure have generated a common opinion that said drastic reduction cannot be practically carried out if diagnostically useful images are desired without limiting too much the imaging volume and so the field of view of the MRI machine, or at least that technical arrangements necessary to guarantee sufficient intensities of the static magnetic field and a sufficient homogeneity thereof cause these small machines to be too much expensive.

Therefore the invention aims at defining a magnetic structure for MRI machines and a small MRI machine that is specifically adapted to acquire diagnostic MRI images of anatomical regions of the hand and/or foot and/or possibly the knee or the elbow, which magnetic structure overcomes above drawbacks in order to limit at least effectively negative results of the dimensional reduction and i.e. an excessive limitation of the extension of the imaging volume with respect to the extension of the volume of the housing cavity and a magnetic field having such an intensity to obtain a receiving signal having such a level to allow the generation of useful diagnostic images, i.e. such intensity of the static magnetic field to guarantee a good resolution of acquired images and a good signal noise ratio.

Therefore as it can be deduced by the above description, in order to make magnetic structures as smallest as possible, guaranteeing wide volumes of cavities housing the patient, imaging volumes as largest as possible and such characteristics of the generated static magnetic field to have the resolution as greatest as possible and to have the signal noise ratio as best as possible, it is not possible to refer to manufacturing and dimensional criteria of known machines since the latter would lead to too big magnetic structures.

In addition to undoubted advantages as regards costs, the reduction of the size of magnetic structures leads to the advantage of making the machines less heavy and less cumbersome, thus making the installation easier. The considerable advantage of MRI machines having limited dimensions and limited weight is the fact of not requiring or of requiring to a limited extent the manufacturing of building structures that are purposely made for MRI machines both as regards the volume of installation rooms and as regards static resistance characteristics of floors. Moreover relatively small machines allow to install various MRI machines in spaces wherein only one machine is generally provided; moreover very small machines can be advantageously mounted on mobile structures such as saddles or the like and they can be used in combination with conventional examination chairs, seats, or beds, thus avoiding costs for acquiring such seats, beds or chairs expressly dedicated to the MRI machine.

The invention achieves the above aims and advantages by providing a magnetic structure for MRI machines, particularly for MRI machines for acquiring diagnostic images of the anatomical region of the hand and/or foot and/or knee and/or elbow or parts thereof, of the type described hereinbefore, wherein the distance between poles of the static magnetic field of the magnetic structure is lower than 30 cm and particularly it is between 10 and 30 cm.

Here, considering the fact that the cavity on the side interfacing the magnetic structure or poles with the cavity itself has to house shimming devices, gradient coils, a RF shield, a gantry, transmitting and receiving coils, the usable space between poles for housing the patient is reduced of 4÷6 cm, i.e. between poles there is a gap between a minimum of 4 and a maximum of 26 cm.

Poles have a surface comprised from between 350 to 2500 preferably from 400 to 2000 cm$^2$.

When poles have a circular or substantially circular shape, they have a diameter comprised from 20 to 56 cm, with a region wherein the static magnetic field is homogeneous to an extent sufficient to acquire useful images in an ideal sphere defining the so called imaging volume and having a diameter from 4 to 16 cm, preferably from 6 to 9 cm.

Poles and/or means generating the magnetic field are made such to generate a static magnetic field with an intensity comprised from 0,05 to 0,3 Tesla, particularly from 0,15 to 0,25 tesla and more particularly 0,25 Tesla.

The homogeneity of said static magnetic field is provided with a peak to peak variation from about 30 to 50 ppm (parts per million) on a sphere or on an ellipsoid having a diameter comprised from 5 to 20 cm, preferably from 6 to 9 cm.

The magnetic structure can be provided with means generating the static magnetic field being of the permanent magnet type or of resistive magnet type or superconducting magnet type or they are composed of combinations of said means.

In an MRI machine of the above type wherein means generating the magnetic field are of the permanent magnet type, the magnetic field is obtained by a combination of a permanently magnetized material layer supported by the yoke and provided at least on two sides, preferably opposite ones with respect to the center of the cavity and a corresponding pole overlaps each one of such magnetized material layers on the side interfacing the cavity, the material being particularly permanently magnetized, wherein the remanence of neodymium has a value from 1.10 to 1.40 T or more. Greater remanences are possible and also advantageous since a lower volume/weight can be obtained with an equal magnetic field. However very high remanences lead to greater costs and so the indicated values are those optimizing costs and simultaneously also optimizing both dimensional and field parameters of the magnet. Said layers of neodymium have a thickness from 2 and 6 cm with a surface extension of the order of the surface of poles or slightly a greater one.

Poles are made of a layer of high permeability material having a maximum permeability of about 6000.

According to an improvement the pole is composed of two layers one of which is a layer of solid material having a thickness from 50% to 75% of the total thickness of poles and a surface equal to the one of poles and a laminated layer having a thickness from 50 and 25% of the total thickness of poles and a surface corresponding to the pole surface. The maximum permeability of the laminated layer is from 5000 to 7000, preferably 6000.

In order to maximize the size of the imaging volume with respect to the volume of the cavity housing the patient the magnetic pole and particularly the solid material surface layer along all the perimetral edge or along parts of perimetral edge at openings of the housing cavity and so of the magnetic structure can have at least a step, preferably a double peripheric step projecting from the remaining surface, particularly a flat one, of the pole surrounded by said step from 0.5 to 3.5 cm with respect to the first step, and with a thickness in the direction parallel to the free surface of the pole from 1 to 2 cm for the first step and from 1 cm to 2 cm for the possible second step.

Said step may be composed of a peripheric tooth of each pole projecting towards the opposite pole or of a thinning step of each pole.

By this arrangement the outward swelling of magnetic field lines along peripheric regions of poles is reduced and therefore the extension of the imaging volume increases in the direction parallel to the surface of poles.

The magnetic yoke has a C or U shape or it is an annular one that is with an O shape and it is made of ferromagnetic material having a carbon contents lower than or equal to 0.22%.

When the yoke has a closed annular or O-shaped section, said yoke has a tubular shape with a round or polygonal cross section, particularly a rectangular or square one, and it is composed of four plates mechanically connected one with the other the cavity being open at the two opposite head sides parallel to the static magnetic field.

When the yoke has a tubular configuration open at one longitudinal side, i.e. parallel to the axis and therefore it has a C or U-shaped section, said yoke is composed of three plates having a width corresponding to the size of the pole. Here, the magnetic structure and therefore the cavity housing the limb opened at two opposite head sides and at an axial side interposed between said two head sides, said two head sides and the axial side being parallel to the static magnetic field.

A further characteristic can provide poles or means generating the static magnetic field to be borne by the magnetic yoke in a diametrically opposite position with respect to the cavity housing the yoke and in a position transversal to, particularly perpendicular to the orientation of the static magnetic field, while plates constituting the yoke and bearing poles or means generating the static magnetic field have dimensions corresponding to the pole surface and i.e. comprised between an axial extension from 1,02 to 2 times the normal length of the limb to be housed in the cavity that is the axial length of at least the yoke substantially corresponds to the axial length of the hand and/or elbow and/or foot and/or wrist and/or knee or preferably slightly greater from 5% to 30%.

The cavity delimited by the yoke in the two directions perpendicular to the axial extension thereof, i.e. in the direction parallel to the static magnetic field and in a direction perpendicular to the direction of the static magnetic field has dimensions from 1,02 to 2 times the corresponding dimension of the limb housed in the cavity of the magnetic structure that is said axial length substantially corresponds to the axial length of the hand and/or elbow and/or foot and/or wrist and/or knee or preferably it is slightly greater from 5% to 30%.

The yoke has an average thickness comprised from 2 and 8 cm, particularly 4 cm.

The imaging volume is delimited by a sphere having a diameter from 5 to 14 cm, preferably about from 6 to 9 cm, particularly for the hand, or by an ellipsoid having a major diameter comprised from 10 to 20 cm and a minor diameter comprised from 5 to 12 cm.

The imaging volume is enough big to allow to have diagnostic images of anatomical regions such as the hand, the wrist, the elbow, the foot or the knee.

Advantageously above diameters regarding the imaging volume substantially correspond to or are slightly greater than inner diameters of the volume housing the anatomical part to be examined of a receiving coil. The latter may have a cylindrical, annular shape, with a circular or elliptic cross section.

By the above combination of dimensional characteristics and of constructional parameters of the magnetic structure it is possible to obtain a magnetic structure as smallest as possible and relatively not so much heavy with respect to MRI machines of the so called "total body" type or of the so called "dedicated" type. Such reduction in size and weight allows also to movably mount the magnetic structure for example with the possibility to translate it according to one or more directions and/or to rotate it, without the need of providing very complex or large supporting and guiding structures and therefore said structures do not weigh on the final size of the MRI machine incorporating the magnetic structure. Particularly said magnetic structure can be easily mounted on a simple wheel-saddle.

The resolution that can be obtained is sufficiently high to obtain optimal diagnostic images and i.e. with pixels having a linear dimension lower than 1 mm, preferably 0.5 mm.

The invention relates also to a machine for acquiring MRI images particularly of the anatomical region of the hand, wrist, foot, elbow and/or knee having a magnetic structure having one or more of the above characteristics.

In this case, the machine further comprises gradient coils, coils transmitting excitation RF pulses, an electromagnetic shield and at least a receiving coil, as well as a possible saddle upon which the magnetic structure is mounted.

In order to further reduce overall dimensions of the machine with an equal usable size of the cavity it is possible to alternatively use the same coil as a transmitting coil and as a receiving coil. By this arrangement a further reduction of the free volume of the cavity is avoided due to the presence of two separated transmitting and receiving coils.

According to the present invention, gradient coils and/or also transmitting coils are composed of laminated packs of conducting paths separated by layers or sheets of electrically insulating material. Particularly there is provided a layer of conducting paths for each gradient coil which layer is separated by a sheet of plastic material from the layer of conducting paths of a further gradient coil. Advantageously layers of conducting paths forming gradient coils are composed of sheets made of electrically conducting material that are suitably cut in order to form conducting paths for the corresponding gradient coil. Thicknesses of conducting material layers are comprised from 0.03 cm to 0.3 cm, particularly 0.06 cm, while thicknesses of insulating layers are comprised from 0.01 cm to 0.05 cm, particularly 0.03 cm. The total thickness of gradient coils integrated in a single laminated element is comprised from 0.1 cm to 2.5 cm, particularly 0.4 cm.

Even the coil transmitting the excitation pulse has a flattened configuration and a thickness comprised from 0.01 cm to 0.1 cm particularly 0.08 cm.

The electromagnetic shield is composed of a plate of electrically conducting material overlapping poles and having a conductivity comprised from 1.7 μΩcm and 2.8 μΩcm, particularly 1.7 μΩcm and a thickness from 10 to 70 μm and, particularly 35 μm.

As an alternative both gradient coils and transmitting coils are composed of printed circuits.

The gap between poles on which gradient coils have been mounted and the corresponding part of the transmitting coil as well as the electromagnetic shield and a possible finishing and covering case is comprised from a minimum of 4 and a maximum of 26 cm.

Even if the machine according to the present invention does not require an examination chair or bed with a construction expressly dedicated for said machine it is however possible to provide a patient-supporting table or bed in combination with the magnetic structure the magnetic structure being mounted on a separated saddle or on means slidably and/or rotatably and/or tiltably supporting the magnetic structure being part of the structure of the patient-supporting table or bed.

According to a further characteristic of the machine, the receiving coil is integrated in the magnetic structure i.e. it is directly associated to the magnetic structure without being provided with a separated case. Particularly, such coil that can be in the form of a printed circuit or the like, is mounted inside the cavity of the magnetic structure between poles there being provided gradient coils and the coil or coils transmitting the excitation signal between it and said poles.

Particularly the receiving coil delimits a sub-cavity of the housing cavity delimited by the yoke and which sub-cavity has an axial length corresponding to the corresponding size of the imaging volume or greater than said corresponding size of the imaging volume.

Advantageously the receiving coil has a tubular shape with a continuous annular section the shape of said cross section corresponding to the cross section along the same plane of the imaging volume. Moreover, the receiving coil extends only for a part of a tubular shaped solid with a continuous annular section the shape of said cross section corresponding to the cross section along the same plane of the imaging volume and the cavity being delimited by the receiving coil open at sides thereof faced or turned towards open sides of the yoke.

When the receiving coil is provided separated from the transmitting coil it defines or delimits the imaging volume at least at some sides or at all sides corresponding to closed sides of the magnetic structure. The space housing the anatomical part to be examined and particularly the hand, foot or elbow or knee defined by the receiving coil or delimited by it therefore corresponds as regards dimensions to the imaging volume or it is slightly smaller than it at least as regards the diameter or diameters of the imaging volume relating to an axis perpendicular to at least one of the open sides of the magnetic structure.

Advantageously, the magnetic structure according to the invention and so the machine for acquiring nuclear magnetic resonance images wherein this magnetic structure is provided, have a tubular shape with a round, elliptic circular section or with a polygonal section, particularly a square or rectangular one.

The yoke has a tubular shape with a round, elliptic circular section or with a polygonal section, particularly a square or rectangular one. The axial length of at least the yoke substantially corresponds to the axial length of the hand and/or elbow and/or foot and/or wrist and/or knee or preferably is slightly greater than it from 5% to 30%.

Means for generating the homogeneous static magnetic field are arranged and are borne by the yoke on two diametrically opposite sides of the inner surface of the yoke and they substantially extend for all the axial length of the yoke. Gradient coils and transmitting coil or coils are provided as to overlap poles generating the magnetic field and have such an extension that is at least twice preferably three times the axial extension of the imaging volume whose size in the axial direction of the yoke is smaller than the one of the axial length of the yoke.

Particularly the axial extension of the imaging volume is smaller than the axial extension of the yoke said extension corresponding to a length from 10% to 40% particularly from 15% to 35% and preferably from 20% to 30% of the total length of the yoke along the same direction.

The imaging volume is centred with respect to the cavity of the tubular yoke both as regards the position in the axial direction and as regards the radial position.

The receiving coil has such a configuration to be extended along a tubular surface having a cross section corresponding to the cross section of the imaging volume or it is slightly smaller than it, the cross section being defined with reference to the longitudinal axis of the tubular yoke. Preferably such ideal surface along which the receiving coil extends is coaxial to the imaging volume.

Advantageously the receiving coil extends along a tubular surface that can have a round, circular, elliptic cross section or a polygonal section, particularly a square or rectangular one.

The axial extension of the receiving coil subtantially corresponds to or it is slightly greater than the axial extension of the imaging volume. Such axial extension of the receiving coil substantially corresponds to or is slightly smaller than the axial extension of gradient coils.

Advantageously the receiving coil is tangent and at least electrically insulated by a layer of insulating material from gradient coils and from the transmitting coil or coils when said transmitting coil and the receiving one are not a single coil used both as receiving and transmitting coil.

This construction with three-dimensional layers inserted one inside the other and comprising, from outside towards the inside, the tubular yoke, gradient coils, the transmitting coil or coils and the receiving coil and possibly an electromagnetic shield between gradient coils and the transmitting coil or coils, is enclosed in a finishing case forming a covering outer case.

Due to reduced size, in the tubular configuration with closed annular section, such case can be composed of two half-cases separated along a transverse plane, particularly perpendicular to the axis of the tubular yoke and which half-cases respectively have a front wall intended to overlap one of the two head sides of the tubular yoke and having an opening coaxial to the volume delimited by the receiving coil, while two tubular parts, an inner one and an outer one intended to overlap the outer shell surface of the tubular yoke and the inner shell surface of the tubular surface along which the imaging coil extends respectively come out from the outer peripheric edge of said front wall and from the peripheric edge of the opening in said front wall.

The axial length of the two tubular outer case parts can be such that, free end edges of said two tubular outer case parts end at the opposite head side of the tubular yoke there being provided with movable means fastening a front wall covering said front side provided with an opening that is coaxial to the inner tubular part of the outer case.

As an alternative the two case parts are divided along an intermediate separating plane, preferably a median one with respect to the axial length of the tubular yoke and both said inner and outer tubular parts are provided with movable mutual fastening means at edges of their free ends. If the separating plane is suitably selected as to be perpendicular to the axis of the tubular yoke and in a median position with respect to the axial length of the yoke, so the two parts are symmetrical one with the other with respect to said plane.

Here, by providing a rotational symmetric geometry of the assembly composed of the tubular yoke, gradient coils, transmitting coil or coils and gradient coil or coils and the possible electromagnetic shield it is possible to use the same constructional case part for covering the magnetic structure on the two head sides thereof. Under these symmetric conditions the same half-case can be coupled both to one head side and to the other one.

Obviously, instead of only two half-cases it is possible to divide each half-case in further parts along different separating planes. Thus for example each half-case can be made of two or four parts separated along separating planes parallel to the longitudinal extension of the tubular yoke said planes being cross-like arranged and preferably perpendicularly one with the other.

Each case or half-case part is obviously provided with means for movably fastening the adjacent case or half-case part.

Movable fastening means can be composed of screws or release snapping means or combinations of these means.

As an alternative to the above tubular shape with a closed annular or O-shaped section the machine or the magnetic structure may have a tubular shape open at the shell wall in order to have a C or U-shaped section. In this case, the two wall parts of the yoke forming the free and opposite arms of the U are intended to bear means generating the magnetic field, gradient coils the transmitting coil or coils as well as the receiving coil.

The receiving coil can possibly correspond to the one described with reference to the tubular yoke with closed annular section and open at the two opposite head ends, i.e. it can extend at each side of the tubular development surface.

It is also possible for the receiving coil to be extended along a development surface with a C or U shaped cross section like the yoke.

As already generally said above, at edges of poles extending along open sides of the yoke, said poles can be provided with a peripheric tooth projecting towards the inner space or the opposite pole or with a reduced end band at which further means generating a magnetic field compensating the outwardly swelling (with reference to the cavity delimited by the magnetic structure) of the static magnetic field at open sides of the magnetic structure are provided. Such means are described in more details in a previous application to the same applicant under the number EP 921 408.

The embodiment according to EP 921 408 provides a magnetic structure wherein in order to maximize the size of the imaging volume with respect to the cavity volume housing the patient each magnetic pole along all the perimetric edge or along parts of the perimetric edge at openings of the housing cavity and so of the magnetic structure has a projection of the magnetized material layer to which a projection of the ferromagnetic material or high-permeability layer is superposed, the total thickness of said two projections of the magnetized material layer and of the ferromagnetic material or high-permeability layer being smaller than the total thickness of the magnetized material layer and of the ferromagnetic material or high-permeability layer, while the thickness of projections of said layers is different with respect to the one of said layers, the projection of the magnetized material layer being preferably thicker than the magnetized material layer.

Particularly, each magnetic pole along all the perimetric edge or along parts of the perimetric edge at openings of the housing cavity and so of the magnetic structure has a projection of the magnetized layer to which a projection of the ferromagnetic material or high-permeability layer is superposed, the total thickness of said two projections of the magnetized material layer and of the ferromagnetic material or high-permeability layer being smaller than the total thickness of the magnetized material layer and of the ferromagnetic material or high-permeability layer, while said projections are separated from said corresponding magnetized material and ferromagnetic material or high-permeability layers by an insert of magnetized material, whose magnetization vector is perpendicular to or it has at least a component perpendicular to the direction of the static magnetic field generated between poles or means generating it.

By the above mentioned characteristics, the magnetic structure according to the invention has a maximum volume size about from 0,03 $m^3$ to about 0.18 $m^3$ having dimensions comprised from 30 cm×32 cm×38 cm and 46 cm×55 cm×68 cm.

The weight of the magnetic structure is from 150 kg to 1200 kg.

Further improvements are object of subclaims.

Characteristics of the invention and advantages deriving therefrom will be more clear from the following description of a not limitative embodiment shown in annexed drawings wherein.

FIGS. 7 to 10 are various constructional detail variants of the structure of poles and yoke that in previous figures are schematically shown as a single constructional part said structures being shown as applied to the magnetic structure both the tubular one and the one having an inverted U-shaped section and each pole being shown according to a different embodiment in each upper half and in each lower half of the figure respectively.

FIGS. 11 and 12 are a side view and a front view respectively of a first preferred embodiment of a magnetic structure according to the present invention.

Figure 14:
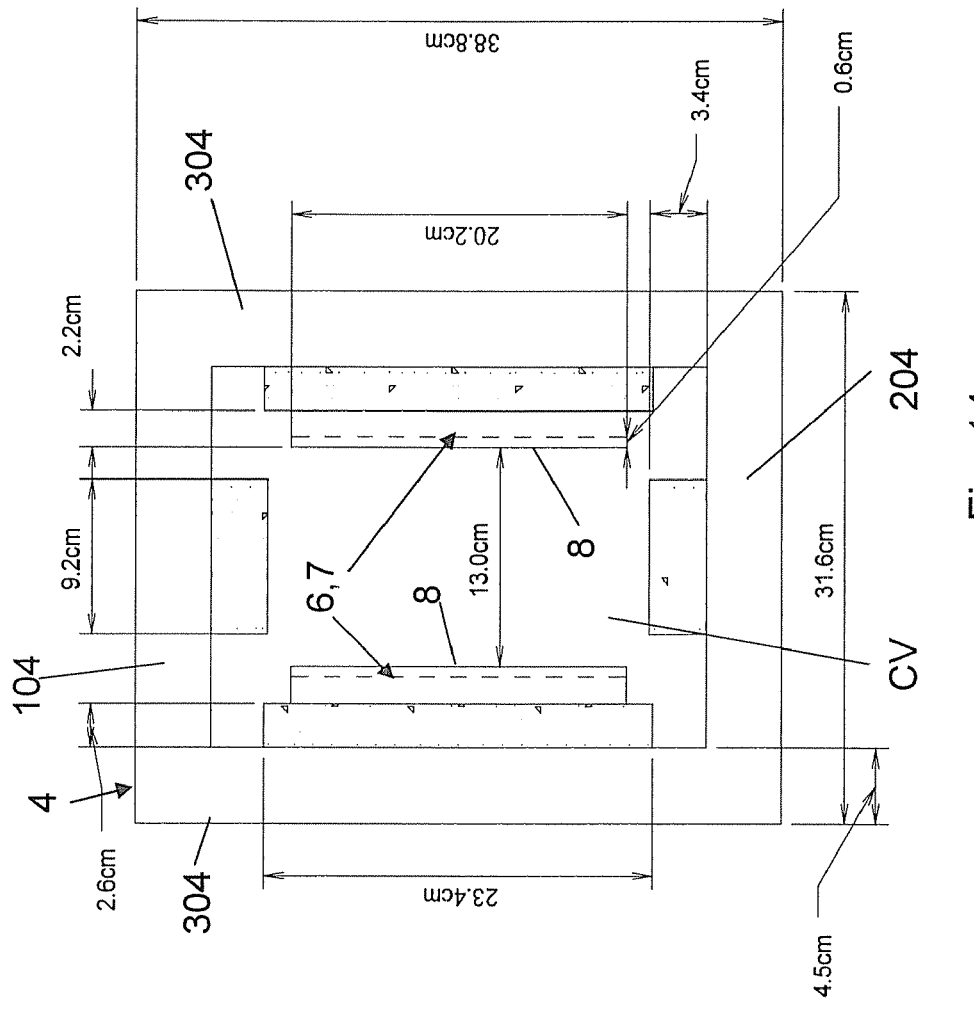
Figure 13:
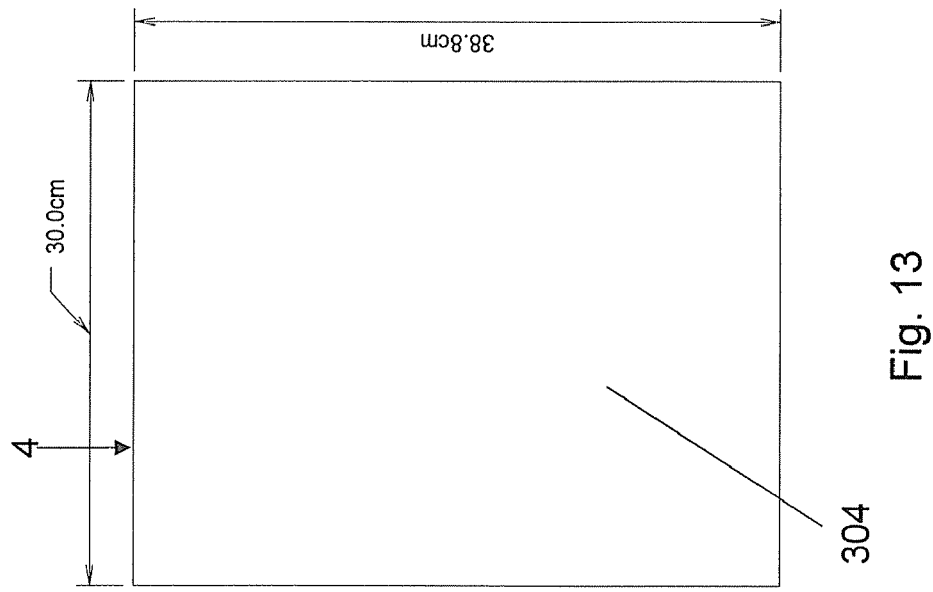

FIGS. 13 and 14 like FIGS. 11 and 12 are a further embodiment of the magnetic structure according to the present invention.

In FIGS. 1 to 10 there is shown the magnetic structure, particularly for nuclear magnetic resonance imaging machines, with reference to an embodiment specifically intended for acquiring MRI images of the hand or of the wrist. However, it is clear that by changing size values such to reach values equal to the maximum size values that are provided and described above, the same magnetic structure can have such a size to be used also for detecting MRI images of the foot and/or of the elbow and/or of the knee. For these two latter anatomical regions, obviously it will not be possible to carry out the examination with the limb associated to the joint in its bent condition, but only with said limb in its deployed condition or in the slightly bent condition, i.e. the forearm and the leg.

Moreover drawings show a magnetic structure wherein even if the ratio between the total size of the structure and the limb shown inside the cavity defined by said structure is substantially a realistic one or corresponds to real conditions, size ratios of various constructional parts are not proportionally indicated with respect to size values indicated in the above description, since they are merely schematic and approximate drawings, that is done in order to visually find in a more easy way various constructional parts and their positioning, the person skilled in the art being able to draw the machine having a size indicated on the basis of quantitative indications and on the general diagram shown in drawings.

Moreover FIGS. 1, 2, 4 and 6 show the assembly composed of the yoke and means generating the static magnetic field Bo as a single constructional part. That in order to understand figures in a more easy way.

Different specific constructions are shown in more details in FIGS. 7 to 10 with reference to the magnetic structure having a tubular yoke or a yoke having an inverted U or C-shaped section respectively.

Figure 2:
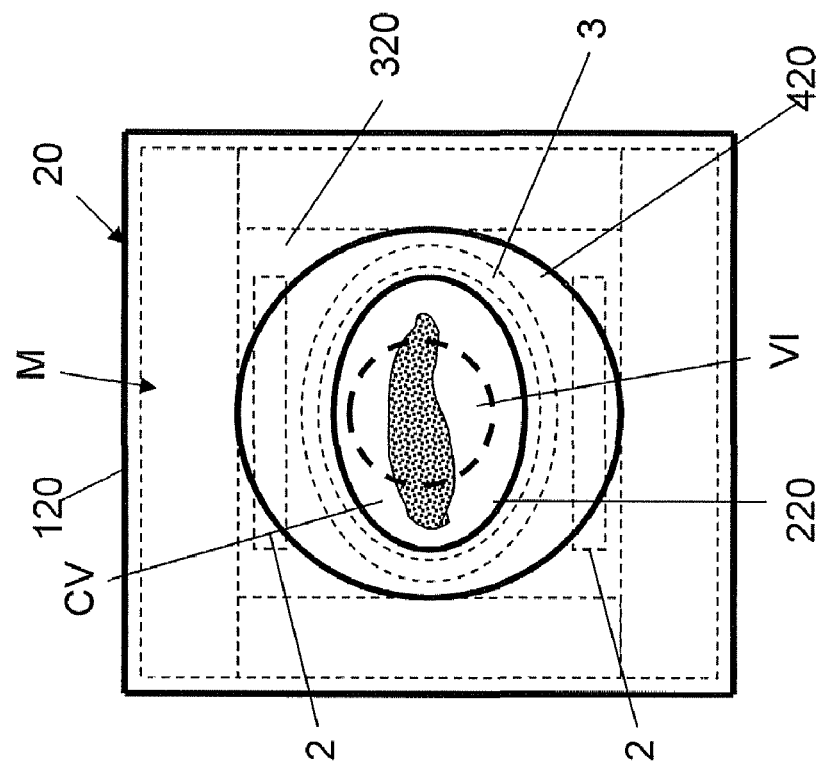
FIG. 2 is a front view of the magnetic structure enclosed in the finishing case according to FIG. 1 the magnetic structure part, i.e. components thereof, being shown by broken lines.
Figure 1:
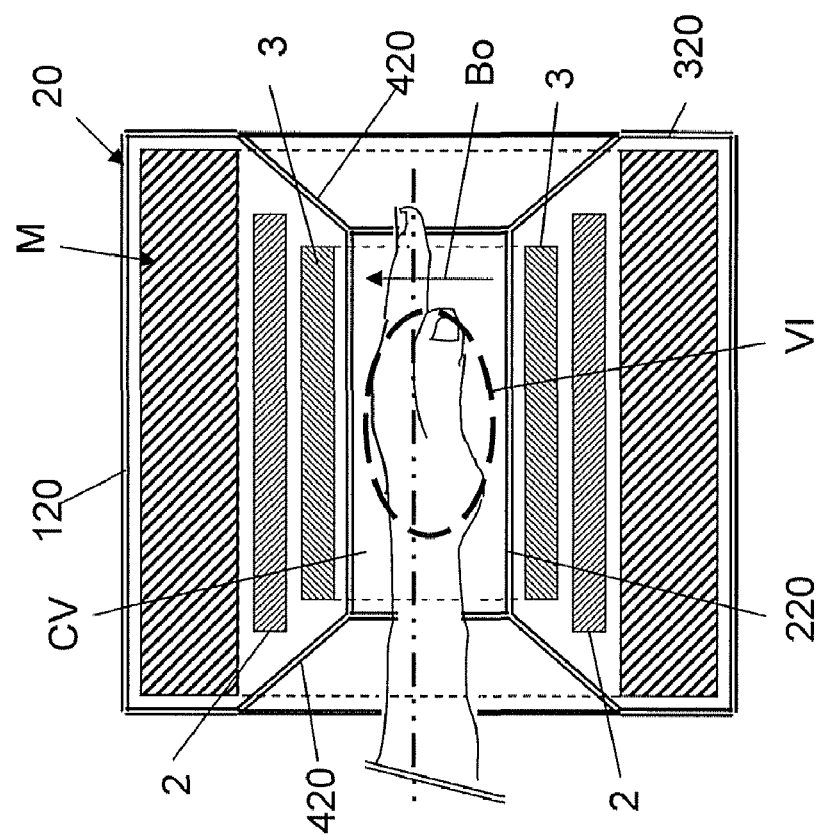
FIG. 1 is a side section schematic view of the magnetic structure enclosed in the finishing case according to the invention and with reference to the example of a machine that is specifically intended for acquiring MRI images of the hand or the wrist.

With reference to FIGS. 1 and 2, a first embodiment of the magnetic structure comprises a tubular yoke having a square cross section and it is open at two opposite head sides. The axial length of the yoke is to 2 times the length of the anatomical region comprising the hand and the wrist. The tubular yoke is shown as a single constructural part together with means generating the static magnetic field that will be described in more details with reference to FIGS. 9 and 10 and said assembly is indicated by M in FIGS. 1 and 2. As it is usually provided in tubular shaped magnetic structures means for generating the magnetic field are provided inside the cavity formed by the yoke and intended to house the part to be examined, on diametrically opposite and spaced sides of said cavity. Particularly means for generating the magnetic field, i.e. poles generating the magnetic field are supported by corresponding diametrically opposite walls of the magnetic yoke at their side faced towards the cavity.

There are further provided coils for generating gradient fields and transmitting coil or coils, as well as possible electromagnetic shields separating the transmitting coil or coils from gradient coils in a condition superposing poles and the side thereof faced towards the cavity. These coils and the possible electromagnetic shield being of known construction to the person skilled in the art are not individually shown in details but they are schematically shown in figures as a single assembly denoted by reference number 2. A further inner layer of the tubular magnetic structure defined in principle by the tubular yoke is constituted by the receiving coil denoted by 3. The latter can have any shape and can be made for example by a pair of flat or slightly bent receiving coils each one superposing the side of the assembly 2 composed of gradient coils, transmitting coils and the possible electromagnetic shield. The two coils are physically separated but are electrically connected one with the other such to form a single antenna receiving the RF signal generated by response echoes of nuclear spins.

The embodiment shown in the present example shows a tubular shaped receiving coil 3 i.e. having a typical shape adapted for acquiring tubular magnetic resonance images.

Apart from the specific construction of the receiving coil it has an outer diameter that is substantially equal to or slightly smaller than the maximum possible distance between assemblies 2 composed of gradient coils, transmitting coils and of the possible electromagnetic shield and than the maximum possible distance according to a direction perpendicular to said first distance between said assemblies 2. Generally, the shape and/or the outer size of the receiving coil are such that the shape and size of the cross section of the cavity delimited by assemblies 2 made of gradient coils, transmitting coils and of the possible electromagnatic shield are used at a greatest extent. The axial length of the receiving coil 3 can be equal to the axial extension of said assemblies 2 or it can be a smaller one such as it is shown. As it is known to the person skilled in the art, since openings of the cavity permeated by the static magnetic field cause magnetic field lines to outwardly swell and so cause it to progressively become unhomogeneous as it approaches said openings, generally the static magnetic field Bo in the cavity has sufficient homogeneity and intensity characteristics only in a partial region of the overall volume of said cavity, therefore the extension of the receiving coil has to be necessarily limited only to the region corresponding to such partial volume wherein the static magnetic field Bo has sufficient homogeneity and intensity characteristics. In the jargon such partial volume is called imaging volume and it is generally delimited by an ideal sphere or ellipsoid. Therefore the axial estension of the receiving coil 3 has to be adapted, that is it has to be smaller, equal to of slightly greater than the corresponding size of the imaging volume along said axial direction. Moreover the receiving coil 3 further delimits the cavity housing the limb to be examined (the hand in this case). Advantageously the cross section of the space defined by an ideal tubular surface along which the imaging coil extends as regards the shape and/or size substantially corresponds to the one of the corresponding section of the imaging volume in the region of its greatest extension on said section plane or it is slightly smaller than size of said section of the imaging volume.

Advantageously gradient coils, the transmitting coil or coils and/or the electromagnetic shield have a construction similar to the one of printed circuits or are composed of a printed circuit wherein paths thereof form conductors of said coils or of said electromagnetic shield. This guarantees the total thickness of these layers of coils embedded one with the other to have a reduced total thickness and therefore the tubular yoke with means generating the static magnetic field Bo to be kept as small as possible, therefore reducing the ratio between the total volume of the magnetic structure and the size of the imaging volume.

Similarly to the fact of ideally defining or delimiting the imaging volume by a sphere or an ellipsoid, the cross section of the ideal surface along which the receiving coil 3 extends has a corresponding circular or elliptic section.

FIGS. 9 and 10 show different constructions of the assembly M composed of the yoke and poles and of means generating the static magnetic field Bo. It has to be noted that figures are divided in two halves according to an horizontal line there being shown for each half different types of construction of the yoke and particularly of poles generating the static magnetic field Bo. Moreover examples of FIGS. 9 and 10 are limited to means generating the static magnetic field of the permanent magnet type. This is not to be considered in a limitative way since it is also possible to provide means generating the magnetic field being composed of electromagnets of the resistive or superconducting type, as it will be explained below in more details, without considerable structural changes.

With reference to the upper half of FIG. 9, the yoke is a tubular one and it is indicated by 4. The yoke has four walls of which only three walls can be seen denoted by 104, 204, 304. With reference to the orientation of the figure the two opposite walls 104 and 204, i.e. the upper wall and the lower wall of the yoke 4, on their side faced towards the cavity have a first layer of magnetized material denoted by 5. At the side of this layer 5 made of magnetized material there is superposed a layer of ferromagnetic material, particularly a high-permeability one that can be made of a single solid plate or as it is shown in figures of a solid plate 6 superposing the side of the magnetized material layer 5 faced towards the cavity and a laminated layer 7 of ferromagnetic material, particularly a high-permeability one and made of a pack of sheets electrically insulated and glued or anyhow made integral one with the other is superposed to such solid plate 6 on the side thereof faced towards the cavity, which sheets on their surface have a plurality of through notches arranged according to a predetermined pattern, in order to reduce effects of eddy currents generated in the ferromagnetic material for example due to variable magnetic fields of gradient coils.

Such construction of means generating the magnetic field is generally known and it is the most simple one.

With reference to the lower half of FIG. 9, the structure of the yoke 4 and of means generating the magnetic field is like the one described with reference to the embodiment relevant to the upper half of FIG. 9, excepting the presence of a peripheric thickened part composed of a peripheric step-like projection 8 at least along sides of the ferromagnetic material plate going along the corresponding open side of the magnetic structure. It can be composed of a separated element such as shown in FIG. 9 or it can be a projection integral with the solid plate 6 the laminated plate 7 being embedded between the two opposite step-like projections 8 and having a thickness smaller than said projections 8. As it is known in the art projections allow to limit the outwardly swelling of the static magnetic field at openings, so under the same axial extension of the magnetic structure, the axial exetension of the imaging volume increases if said projections 8 are provided and this is advantageous since it allows to further limit the size of the magnetic structure in the axial direction under the same imaging volume, whose limits are fixed by the size and morphology of the region to be examined.

In FIG. 10 there are shown further variants with respect to constructional configurations of means generating the magnetic field shown in FIG. 9. In this case they are constructional variants that can be provided as an alternative or in combination with the step-like projection 8 of the embodiment of means generating the magnetic field shown in the lower half of FIG. 9. The construction of said means is substantially like what is described with reference to the basic constructional configuration of means generating the magnetic field excepting the fact that in the variant of the upper half of FIG. 10 there is provided an end extension 105 both of the magnetized material layer and of the ferromagnetic material plate. The extension of the ferromagnetic material plate is indicated by 9, while the one of the magnetized material layer is indicated by 105. The magnetized material extension 105 and the ferromagnetic material one extends along all the edge of means generating the magnetic field faced or turned towards the corresponding opening of the cavity and for a certain axial penetrating length. The magnetization of the end extension of the magnetized material layer is greater than the one of the adjacent central magnetized material layer 5 and so the total thickness of the magnetized material extension 105 and of the extension 9 of the ferromagnetic material plate is smaller than the total thickness of the central part of the magnetized material layer 5 and of the ferromagnetic material plate intended as the assembly composed of the solid plate 6 and the laminated plate 7.

The effect is similar to the one of the step-like projection 8 shown in the variant of the lower half of FIG. 9, but on the contrary it avoids a reduction of the span of the cavity opening and so it allows to maximize said opening with respect to corresponding size of the magnetic structure.

The greater magnetization of the magnetized material extension 105 can be obtained by using a different alloy that can be magnetized in a permanent way or it is possible to provide a different ratio between thicknesses of the magnetized material extension 105 and the ferromagnetic material extension 9 with respect to the one of the magnetized material layer 5 with respect to the ferromagnetic material plate composed of the solid plate 6 and of the laminated one 7. Such change in the ratio of thickness of said layers provides in this case the magnetized material extension 105 to be more thick than the ferromagnetic material extension 9 and also more thick than the magnetized material layer 5.

The constructional configuration shown in the lower half of FIG. 10 is a variant to the one of the upper half, in the fact that between magnetized material extensions 105 and ferromagnetic material extensions 7 and the corresponding edge faced thereto of the central magnetized material part 5 and of the ferromagnetic material plate composed of the solid plate 6 and of the laminated one 7 there is provided a rod 10 of magnetized material particularly of neodymium having a magnetization vector oriented with at least a component perpendicular to the magnetic field Bo.

Even this construction allows to obtain advantages of limiting the outwardly swelling of the static magnetic field Bo at openings of the cavity. Said constructions of means generating the static magnetic field Bo are known and described in more details for example in EP 921408.

As regards means generating the static magnetic field Bo of the resistive or superconducting magnet type, in addition to known constructions of these magnets, it is possible to change the permanent magnet solution in a resistive or superconducting magnet solution by substantially keeping the same geometry of permanent magnet means generating the static magnetic field Bo such as it is described in details in EP 1 300 688 to the same applicant, so the person skilled in the art has no problems in alternatively providing means generating the static magnetic field Bo of different type without substantially affecting the size of the magnetic structure if not to a minimum extent.

As it results from FIGS. 1 to 5 and 9 and 10, the magnetic structure comprising the yoke 4 means generating the static magnetic field Bo, gradient coils and the transmitting coil or coils and the possible electromagnetic shield indicated altogether by 2 and the receiving coil 3 are enclosed in a single common outer covering case. Therefore the machine is different from current dedicated or total-body machines, wherein particularly the receiving coil is composed of a separated member that can be mounted and disassembled as well as replaced, and which receiving coil has a case dedicated and separated from the covering case of the magnetic structure. So here means for removably mechanically coupling and electrically connecting the receiving coil with the remaining part of the magnetic structure are completely removed with a considerable advantage both as regards the size compactness and costs.

In the embodiment of FIGS. 1 to 5 and 9 and 10 wherein the magnetic structure comprising the yoke 4 means generating the static magnetic field Bo, gradient coils and the transmitting coil or coils and the possible electromagnetic shield indicated altogether by 2 and the receiving coil 3 have a substantial tubular geometry and are arranged on various concentric or susbstantially concentric layers, the case 20 has a tubular shell 120 externally covering the yoke and a tubular shell 220 internally covering the assembly of coils 2, 3 extending inside the receiving coil completely covering the inner walls thereof i.e. walls delimting the volume actually housing the limb to be examined. Therefore the two inner and outer shells 120 and 220 are connected at the two head sides of the magnetic structure by a front wall 320 covering the front side of the magnetic structure and the assembly of coils and shields 2,3.

Since the axial length of various coils and shields may progressively change with radius and particularly it can decrease as the cavity defined by the yoke 4 becomes smaller due to the provision of various coils 3 of possible shields and of the receiving coil, the two tubular shells 120 and 220 may have ends 420 connecting to front sides 320 progressively radially enlarging, for example in a conical way, starting from the diameter of the inner tubular shell towards the diameter of the outer tubular shell 120 and from the inside towards the outside of the cavity in the axial direction thereof.

A case 20 of this type can be made by said parts 120, 220, 320, 420 that are separated and can be removably secured and i.e. by an outer tubular shell 120, an inner tubular shell 220 and by two conical or radially enlarging connecting ends 420 and by two front walls 320, each one provided of means for the connection or removable fastening to the corresponding adjacent constructional part.

Figure 4:
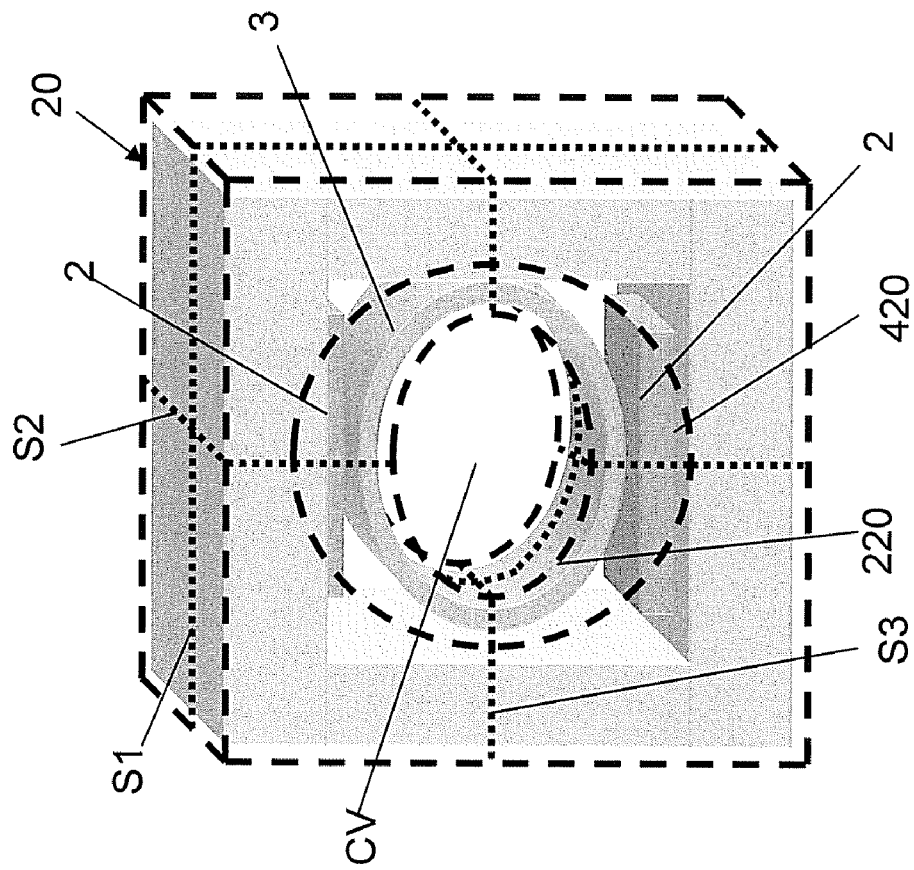
FIG. 4 is a view like FIG. 3, the case being shown by broken lines and parts constituting the yoke, gradient and trasmitting coils and the receiving coil being shown by continuous lines.
Figure 3:
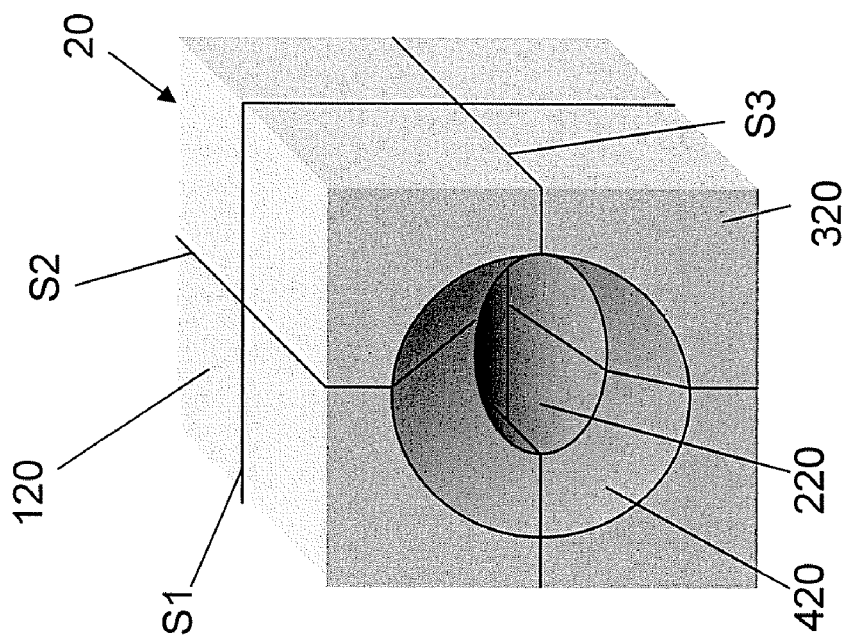
FIG. 3 is a perspective view of the machine according to the present invention.

A constructional manufacturing variant of said case 20 is shown in FIGS. 3 and 4. Here, the case 20 can be made of two half-cases each one comprising a front side 320 an outer shell part 120 for an axial extension smaller than the total one and a connecting part 420 and an inner shell part 220 for an axial extension smaller than the total one, which parts are integrally made.

The axial extension of the outer shell and of the inner shell is defined by a line separating the two half-cases extending along a plane separating them that is transversal and preferably perpendicular to the axial extension of the magnetic structure. When said magnetic structure is symmetrical with respect to such separating plane denoted by S1 in FIGS. 3 and 4 and i.e. when such plane is the median plane perpendicular to the longitudinal extension of the magnetic structure and when the latter is rotationally symmetrical with respect to the central longitudinal axis, so the two half-cases can be identical, so a considerable reduction of manufacturing costs is obtained a single mold for both the half-cases being necessary.

Each one of said half-cases can be further composed of two parts for example separated according to a separating plane perpendicular to the separating median plane S1 perpendicular to the longitudinal axis of the magnetic structure. In this case the choice can be the plane defined by the separating line S2 or S3. As an alternative it is possible for all three separating planes to be arranged perpendicular one with respect to the other and defining separating lines S1, S2, S3 shown in FIGS. 3 and 4. Such division can be an appropriate one when the rotational symmetry is not a complete one, but when it is valid only for some parts of the case. The above described half-case is therefore divided in four parts so for example if two diagonally opposite parts are identical and the two head ends of the magnetic structure a single mould will be sufficient for four case parts.

The mutual fastening of case parts or of half-cases can occur by means of screw mutual fastening means or by release snapping means or by combinations of these means. Such means are within the reach of the person skilled in the art that can choose among a number of known and widely used alternatives used in making covering cases or boxes.

Figure 5:
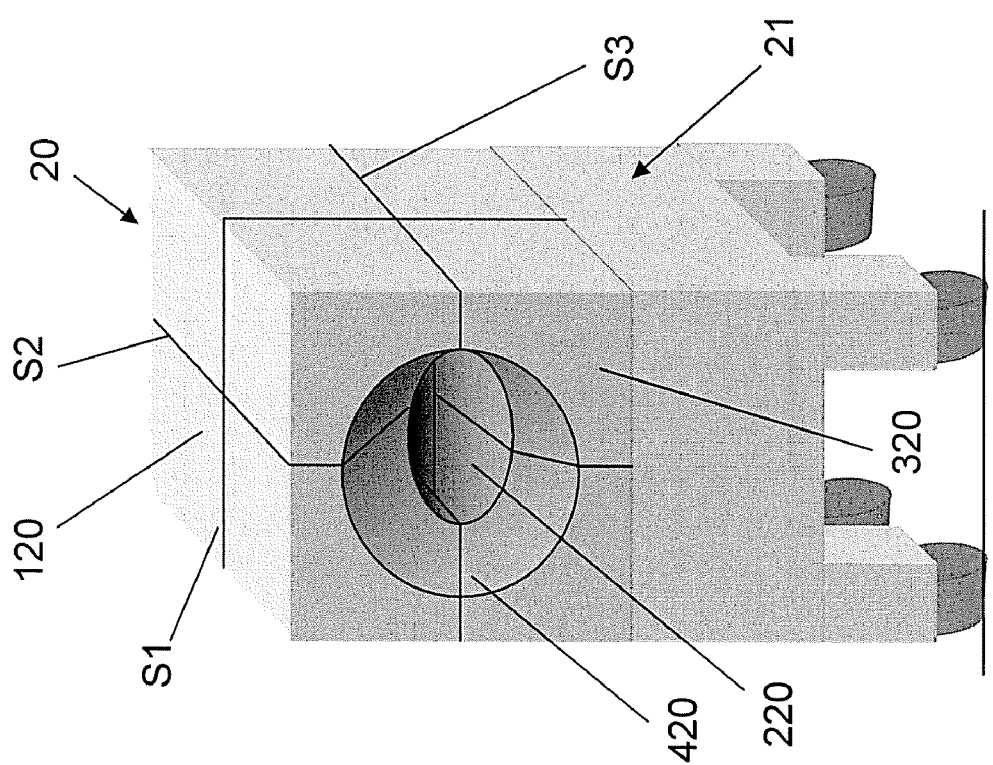
FIG. 5 is the machine of FIG. 3 mounted on a saddle.

FIG. 5 shows the magnet according to FIGS. 1 to 4 and 9 and 10 mounted on a saddle 21 provided with wheels 121. This is possible by the considerable size compactness of the magnetic structure. The saddle can advantageously form the space for housing electronic devices controlling the MRI machine and for processing, displaying and storing MRI images.

Figure 6:
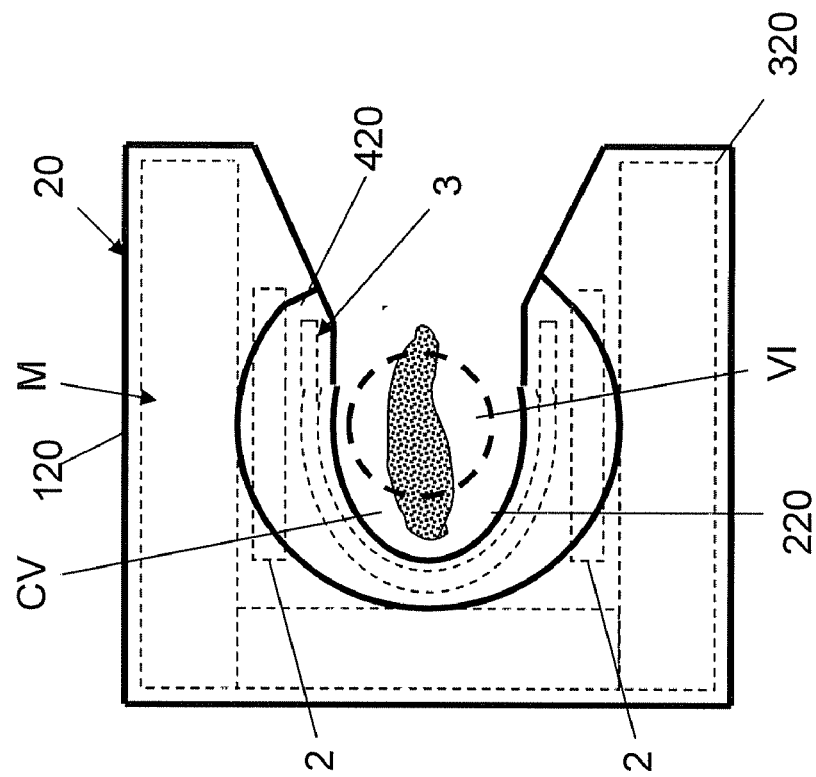
FIG. 6 is a section side view like FIG. 2 of the machine with a magnetic structure having a laterally inverted U-shaped section.
Figure 7:
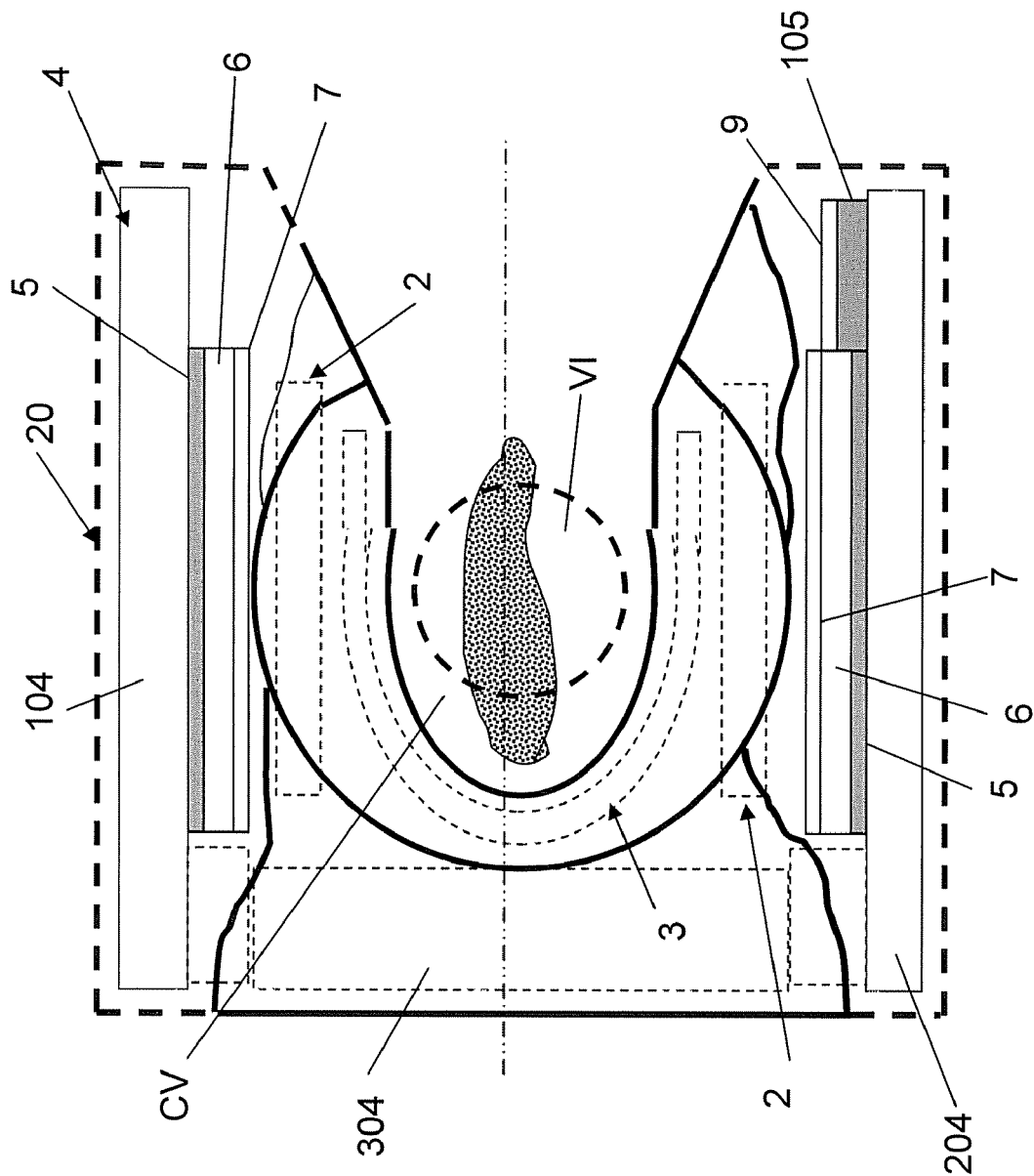
Figure 8:
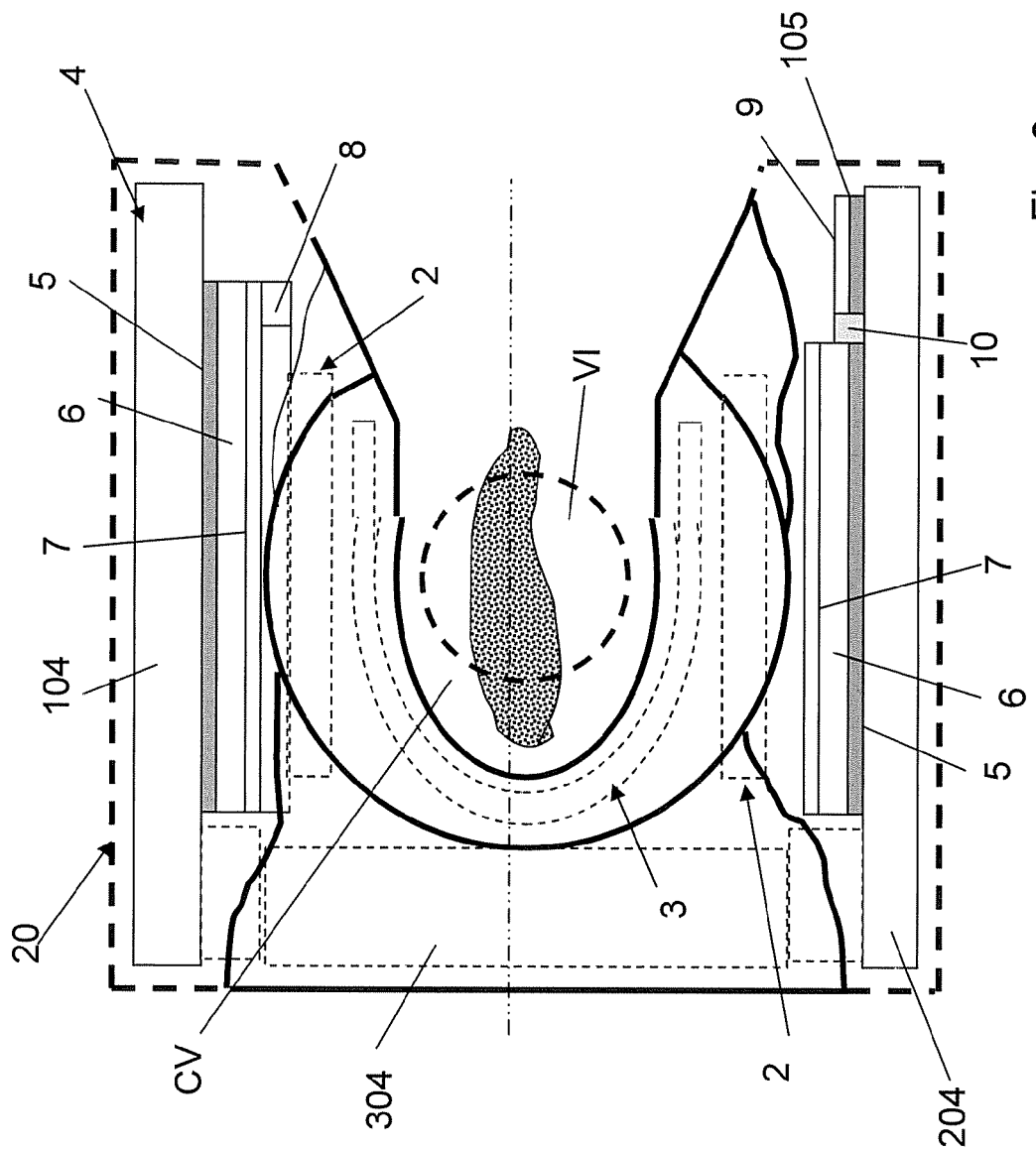

FIGS. 6, 7 and 8 show a variant of the magnetic structure according to the invention wherein it has a laterally inverted U or C-shaped section.

In principle magnetic structure according to FIGS. 6 to 8 derives from the one according to previous FIGS. 1 to 5 and 9 and 10 by removing one of the two side walls 204 of the yoke 4. Therefore in this case the cavity defined by the magnetic structure is open and it is possible to have access therein both from head sides perpendicular to the longitudinal extension and from a longitudinal side. Advantageously such as it is shown in figures, the receiving coil 3 will be open along the longitudinal side adjacent the open longitudinal side of the magnetic stucture. Particularly the open longitudinal side of the magnetic structure is one of the two side parallel to the static field Bo, that is parpendicular to sides 105 and 304 of the yoke 4 supporting means generating the static magnetic field Bo. As it is clear in figures, the case 20 is open at the open longitudinal side of the magnetic structure in order to allow the entrance to the cavity i.e. the imaging volume also from said longitudinal side. However by considering possible described asymmetries various constructional variants of the case can be easily applied without conceptual changes even to this particular configuration of the magnetic structure.

FIGS. 7 and 8 like FIGS. 9 and 10 show different examples for making means generating the static magnetic field Bo based on permanent magnets. As it is clear from figures the making is perfectly equal to the one of the corresponding embodiments described for the tubular magnetic structure with reference to FIGS. 9 and 10. Therefore in FIGS. 7 and 8 constructional parts equal to the ones of FIGS. 9 and 10 are indicated by the same reference numbers and the description relevant to FIGS. 9 and 10 is to be corrispondently applied also to FIGS. 7 and 8, with a single difference. While in FIGS. 7 and 8 both the step-like projection 9 and the peripheric extensions of the magnetized material layer 105 and of the superposed ferromagnetic material layer 9 are shown only along the edge of means generating the static magnetic field parallel to the open longitudinal side, this step 9 and/or extensions 105 of the magnetized material layer 9 and of the ferromagnetic material layer can extend also along edges of means generating the static magnetic field Bo parallel to open head sides of the magnetic structure like what is described and shown in FIGS. 9 and 10. This is advantageous but it is not absolutely necessary since the configuration of FIGS. 7 and 8 can be well used wherein the projection and/or the extension 105 and 9 are provided along only the edge of means generating the static magnetic field Bo parallel to the open longitudinal side of the magnetic structure. The above obviously is also for the variant providing the rod 10 made of magnetized material particularly neodymium. Said configurations provided for the magnetic structure having a C or U-shaped cross section are also described in details in the already above mentioned EP 921 408. The provision of means generating the static magnetic field Bo in the form of resistive or superconducting magnets can be applied to the example of FIGS. 6 to 8 in a way similar to what is described with reference to the tubular configuration of the magnetic structure and such application is also desribed in already above mentioned EP 1 300 688 to the same applicant.

Like the machine having the tubular magnetic structure, even the magnetic structure having the U or C-shaped section can be mounted on a saddle like indicated in FIG. 5 and it can be provided with all variants provided for the saddle, the overall size of the magnetic structure being substantially equal for the two configurations of the magnetic structure.

FIGS. 11 and 12 show a magnetic structure comprising a tubular shape with a rectangular section with relevant dimensions. In figure there are indicated dimensions of parts having reference numbers like the ones of previous figures for equal parts or having the same tasks.

The magnetized material layer 5 has a rectangular shape and it extends for all the axial length of the housing cavity CV and of corresponding delimiting walls. Unlike previous figures, in this example magnetized material layers 5 and poles 6, 7 are supported by vertical walls 304, 404 of the yoke, while walls 104, 204 bear a further element 5' made of magnetized material.

Poles 6, 7 can be composed of solid material or partly by solid material and partly by laminated material such as described with reference to previous embodiments. Poles are circular ones and have a diameter of 42,2 cm, that is slightly lower than the length of sides of the magnetized layer having a length of 46 cm.

Along all the perimetric edge of poles, the latter are provided with a tooth projecting for 0.6 cm and having an axial thickness approximatively from 0,5 to 1,5 cm, preferably 1 cm.

In the median region of both opposite vertical walls 304, 404 of the yoke, each one has a median hollow band 504 passing from one head side to head side, being oriented with the longitudinal axis parallel to the longitudinal axis of the housing cavity CV. Said hollow band has a width corresponding to some dozens of cm particularly about 20 cm and a depth about from 2 to 5 cm.

The magnetic structure shown in FIGS. 13 and 14 is different from the one shown in FIGS. 11 and 12, mainly due to different size and moreover also due to the fact that the hollow band 504 is not present.

Particularly, the magnetic structure according to FIGS. 13 and 14 is made in order to be used particularly for examinating the hand, while the magnetic structure of FIGS. 11 and 12, is intended to examine not only the hand but also the foot and the knee.

It is clear from shown examples that choices of size and physical parameters as well as the kind of material have allowed to make a magnetic structure and an MRI machine that allow to efficacely acquire optimum images and at the same time they have very small size and above all they have such a weight that is very low and it allows to easily transport the magnetic structure and so the MRI machine.

The invention claimed is:

1. Magnetic structure for MRI machines, which machine has a geometry having a U or C-shaped section or an annular or O-shaped section, the magnetic structure having at least two opposite poles to which means for generating a magnetic field between said poles are associated and which poles are borne at a predetermined distance one with respect to the other by walls of a magnetic yoke having an inverted U shape or an annular or O shape, which poles or which means generating the magnetic field and/or at least a part of which yoke delimit a cavity housing at least a part of the patient body, while inside the volume of said cavity in an imaging volume the generated magnetic field has such a homogeneity characteristic to guarantee the acquisition of MRI images having predetermined required quality characteristics, wherein the magnetic structure is adapted for detecting diagnostic images of the anatomical region of the hand and/or foot and/or knee and/or elbow or parts thereof, wherein the free distance between poles of the magnetic structure is lower than 30 cm, and wherein the homogeneity of said field is provided with a peak to peak variation from about 30 to 50 ppm on a sphere or on an ellipsoid having diameters comprised from 5 to 20 cm.

2. Magnetic structure according to claim 1, wherein poles and/or means generating the static magnetic field are made such to generate a static magnetic field with an intensity comprised from 0.05 to 0 3 Tesla.

3. Magnetic structure according to claim 1, wherein means generating the magnetic field are of permanent magnet type and the magnetic field is obtained by a combination of a layer of permanently magnetized material borne by the yoke and it is provided at least on two walls of the yoke that form opposite sides with respect to the centre of the housing cavity and a corresponding pole is superposed to each one of such magnetized material layers on the side interfacing the cavity, the permanently magnetized material being composed of neodymium, wherein the neodymium remanence has a value of 1.1 Tesla or more and which neodymium layers have a thickness comprised from 2 to 6 cm with a surface extension corresponding to the surface of poles or slightly greater than it.

4. Magnetic structure according to claim 3, wherein poles are made of a high-permeability material layer having a maximum permeability of 6000.

5. Magnetic structure according to claim 3, wherein each pole has a ferromagnetic material layer composed of at least two layers one of which is a solid material layer having a thickness from 50% to 75% of the total thickness of poles and a surface equal to the one of poles and the other one is a laminated layer having a thickness comprised from 50 to 25% of the total thickness of poles and a surface corresponding to the pole surface, the maximum permeability of the laminated layer being comprised from 5000 to 7000.

6. Magnetic structure according to claim 1, wherein at open sides of said magnetic structure coinciding with open sides of the cavity housing the limb or part thereof, peripherically to only one or to some or all edges of poles or of means generating the magnetic field there are provided active or passive magnetic means reducing the outwardly swelling of magnetic field lines along peripheric regions of poles and/or maximizing the imaging volume with respect to the volume of the housing cavity in a direction parallel to the surface of poles.

7. Magnetic structure according to claim 6, wherein in order to maximize the size of the imaging volume with respect to the volume of the cavity housing the patient each magnetic pole along all the perimetral edge or along parts of perimetral edge at openings of the housing cavity and so of the magnetic structure has at least a double peripheric step projecting from the remaining surface of the pole surrounded by said step from 0.5 to 3.5 cm with respect to the first step, and with a thickness in the direction parallel to the free surface of the pole from 1 to 2 cm for the first step and from 1 cm to 2 cm for the second step.

8. Magnetic structure according to claim 1, wherein the yoke is made of a ferromagnetic material having a carbon contents lower than or equal to 0.22%.

9. Magnetic structure according to claim 1, wherein the yoke has an average thickness from 2 to 8 cm.

10. Magnetic structure according to claim 1, wherein it has a volume size from about 0.03 $m^3$ to about 0.18 $m^3$.

11. Magnetic structure according to claim 10, wherein it has dimensions comprised from 30 cm×32 cm×38 cm and 46 cm×55 cm×68 cm.

12. Magnetic structure according to claim 1, wherein the weight of the magnetic structure is comprised from 150 kg to 1200 kg.

13. Magnetic structure according to claim 1, wherein the axial extension of the imaging volume is smaller than the axial extension of the yoke, said extension corresponding to a length from 10% to 40% of the total length of the yoke along the same direction.

14. Magnetic structure according to claim 1, wherein the imaging volume is delimited by a sphere having a diameter from 5 to 14 cm, or by an ellipsoid having a major diameter comprised from 10 to 20 cm and a minor diameter comprised from 5 to 12 cm.

15. Magnetic structure according to claim 1, wherein it comprises a yoke delimiting a cavity housing a limb to be examined which yoke on two opposite sides of the cavity delimited by it bears means generating a static magnetism field and which yoke is provided in combination with one or more gradient coils generating variable magnetic fields and at least a transmitting coil generating a signal exciting nuclear spins in the limb under examination as well as at least a receiving coil receiving signals generated by echoes of nuclear spins, said coils being housed inside the cavity and being superposed to one or more walls of the yoke delimiting it and/or to poles or to means generating the magnetic field, the receiving coil being also integrated in the magnetic structure.

16. Magnetic structure according to claim 15, wherein the receiving coil is provided as the last one according to an arrangement order by substantially concentric inner layers from inner sides of the yoke delimiting the cavity to the central region of said cavity and said receiving coil completely delimiting closed sides of the magnetic structure or only some or part of some of said sides faced towards the closed sides of the magnetic structure a sub-volume of the cavity delimited by the yoke, said sub-volume having a size substantially equal to or slightly smaller than the one of the imaging volume at least in a median section plane parallel to the static magnetic field and transversal or perpendicular to the longitudinal axis of the magnetic structure or of the cavity delimited by said magnetic structure.

17. Magnetic structure according to claim 1, wherein it generates an image resolution lower than 1 mm.

18. Machine for detecting MRI images of the anatomical region of the hand, wrist, foot, elbow and/or knee having a magnetic structure having one or more of the characteristics according to claim 1.

19. Machine according to claim 18, wherein the transmitting coil or coils transmitting excitation RF pulses has an electromagnetic shield between the receiving coil and the gradient coil or coils.

20. Machine according to claim 18, wherein the magnetic structure can be transported being mounted on transporting means or on a saddle.

21. Machine according to claim 20, wherein the saddle forms a space for housing at least a part of the electronics for controlling and processing images.

22. Machine according to claim 18, wherein the gradient coils and/or also the transmitting coils and/or the receiving coil are composed of laminated packs made of conducting paths separated by layers or sheets made of electrically insulating material.

23. Machine according to claim 22, wherein thicknesses of layers made of conducting material are from 0.03 cm to 0.3 cm, while thicknesses of insulating layers are from 0.01 cm to 0.05 cm.

24. Machine according to claim 18, wherein the total thickness of gradient coils integrated in a single laminated element is from 0.1 cm to 2.5 cm.

25. Machine according to claim 18, wherein the coil transmitting the excitation pulse has a flattened structure and a thickness comprised from 0.01 cm to 0.15 cm.

26. Machine according to claim 18, wherein the electromagnetic shield is composed of a plate made of electrically conducting material superposing poles and having a conductivity from 1.7 $\mu\Omega$cm and 2.8 $\mu\Omega$cm and a thickness from 10 to 70 $\mu$m.

27. Machine according to claim 18, wherein the gap between poles upon which gradient coils have been mounted and the corresponding part of the transmitting coil as well as the electromagnetic shield is comprised from a minimum of 4 to a maximum of 26 cm.

28. Machine according to claim 18, wherein the magnetic structure together with means generating the static magnetic field and with gradient coil or coils, with the transmitting coil or coils and/or with the electromagnetic shield and with the receiving coil are covered by a single common case completely covering said parts both on the outer side out of the magnetic structure and along surfaces of the receiving coil delimiting the sub-cavity housing the limb.

29. Machine according to claim 28, wherein the magnetic structure comprising the yoke together with means generating the static magnetic field and with gradient coil or coils, with the transmitting coil or coils and/or with the electromagnetic shield and with the receiving coil are made like three-dimensional layers inserted one inside the other and concentric with respect to the axis of the cavity delimited by the yoke and/or to the sub-cavity delimited by the receiving coil, which structure, from the outside towards the inside, comprises the tubular yoke, gradient coils, the transmitting coil or coils and the receiving coil and an electromagnetic shield between the receiving coil and gradient coils, such case being made of at least two half-cases separated along a plane perpendicular to the axis of the tubular yoke.

30. Machine according to claim 28, wherein each part of the case or half-case is provided with means for movably fastening to the adjacent part of the case or half-case.

31. Machine according to claim 28, wherein the magnetic structure has tubular shape open at the shell wall in order to have a C or U-shaped cross section, the assembly composed of means generating the static magnetic field, gradient coil or coils, transmitting coil or coils and/or the electromagnetic shield and the receiving coil being also inscribable or extending along open tubular surfaces having a C or U-shaped cross section and openings of said surfaces coinciding with openings of the yoke, the two wall parts of the yoke forming free and opposite arms of the U being adapted to bear means generating the magnetic field, gradient coils and the transmitting coil or coils as well as the receiving coil.

32. Machine according to claim 31, wherein the receiving coil is a tubular one having a closed annular section and opened at the two opposite head ends or the receiving coil extends along a development surface having a C or U-shaped cross section like the yoke.

33. Machine according to claim 2, wherein it has a single covering case for the assembly composed of the yoke and of means generating the static magnetic field, of gradient coil or coils, of transmitting coil or coils and/or of the electromagnetic shield and of the receiving coil.

34. Magnetic structure for an MRI machine, comprising:
 a yoke having a U or C-shaped section or an annular section with two opposite walls at a predetermined distance one from the other;
 at least two opposite poles to which means for generating a magnetic field between said poles are associated, said poles being borne at a predetermined distance one with respect to the other by layers of permanently magnetized material of the opposite walls of the yoke;

the poles or the means for generating the magnetic field or at least a part of the yoke delimiting a cavity for housing at least a part of a patient body, wherein inside the volume of said cavity in an imaging volume the homogeneity of said magnetic field is provided with a peak to peak variation from about 30 to 50 ppm on a sphere or on an ellipsoid having diameters from 5 to 20cm;

said poles being made of a high permeability material layer having a maximum permeability of 6000;

the free distance between said poles being lower than 30 cm;

wherein said poles have a surface area from 350 to 2500 cm$^2$;

the layers of permanently magnetized material being composed of neodymium, wherein the neodymium remanence has a value of 1.1 Tesla or more and said layers have a thickness from 2 to 6 cm with a surface extension corresponding to or slightly greater than the surface of the poles;

each pole having a ferromagnetic material layer composed of at least two layers, one of the at least two layers being a solid material layer having a thickness from 50% to 75% of the total thickness of the pole and an other of the at least two layers being a laminated layer having a thickness from 50 to 25% of the total thickness of pole, the maximum permeability of the laminated layer being from 5000 to 7000;

the axial extension of the imaging volume being smaller than the axial extension of the yoke and corresponding to a length from 10% to 40% of the total length of the yoke;

the imaging volume being delimited by an ideal sphere having a diameter from 5 to 14 cm, or by an ellipsoid having a minor diameter from 10 to 20 cm and a minor diameter from 5 to 12 cm; and the magnetic structure having a volume size from about 0.03 m$^3$ to about 0.18 m$^3$, dimensions from 30 cm×32 cm×38 cm to 46 cm×55 cm×68 cm and a weight from 150 kg to 1200 kg.

* * * * *